United States Patent
Yoshida et al.

(10) Patent No.: US 11,233,029 B2
(45) Date of Patent: Jan. 25, 2022

(54) SEMICONDUCTOR DEVICE HAVING A DEVICE FIXED ON A SUBSTRATE WITH AN ADHESIVE

(71) Applicant: Mitsubishi Electric Corporation, Tokyo (JP)

(72) Inventors: Kazuo Yoshida, Hyogo (JP); Masato Negishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 405 days.

(21) Appl. No.: 14/766,414

(22) PCT Filed: Oct. 15, 2013

(86) PCT No.: PCT/JP2013/077979
§ 371 (c)(1),
(2) Date: Aug. 6, 2015

(87) PCT Pub. No.: WO2014/167745
PCT Pub. Date: Oct. 16, 2014

(65) Prior Publication Data
US 2015/0371966 A1 Dec. 24, 2015

(30) Foreign Application Priority Data
Apr. 10, 2013 (JP) .............................. JP2013-082088

(51) Int. Cl.
*H01L 23/544* (2006.01)
*H01L 23/00* (2006.01)
(Continued)

(52) U.S. Cl.
CPC ............ *H01L 24/32* (2013.01); *H01L 21/268* (2013.01); *H01L 21/302* (2013.01); *H01L 21/78* (2013.01);
(Continued)

(58) Field of Classification Search
CPC ......... H01L 24/32; H01L 21/78; H01L 29/30; H01L 24/83; H01L 21/302; H01L 33/095;
(Continued)

(56) References Cited

U.S. PATENT DOCUMENTS

2002/0125557 A1 9/2002 Chen et al.
2002/0185752 A1 12/2002 Ishikawa et al.
(Continued)

FOREIGN PATENT DOCUMENTS

CN  1938869 A   3/2007
CN  102738336 A  10/2012
(Continued)

OTHER PUBLICATIONS

Notification of Transmittal of Translation of the International Preliminary Report on Patentability and Translation of Written Opinion of the International Searching Authority; PCT/JP2013/077979; dated Oct. 22, 2015.
(Continued)

*Primary Examiner* — Kimberly N Rizkallah
*Assistant Examiner* — Dilinh P Nguyen
(74) *Attorney, Agent, or Firm* — Studebaker & Brackett PC

(57) ABSTRACT

A semiconductor device according to the present invention includes a mount substrate, an adhesive applied to the mount substrate, and a device having its lower surface bonded to the mount substrate with the adhesive. The surface roughness of a side surface upper portion of the device is lower than that of a side surface lower portion of the device.

5 Claims, 5 Drawing Sheets

(51) Int. Cl.
*H01L 21/268* (2006.01)
*H01L 21/302* (2006.01)
*H01L 21/78* (2006.01)
*H01L 29/30* (2006.01)
*H01L 21/683* (2006.01)

(52) U.S. Cl.
CPC .............. *H01L 24/05* (2013.01); *H01L 24/06* (2013.01); *H01L 24/83* (2013.01); *H01L 24/95* (2013.01); *H01L 29/30* (2013.01); *H01L 21/6836* (2013.01); *H01L 24/29* (2013.01); *H01L 24/48* (2013.01); *H01L 24/92* (2013.01); *H01L 2221/68327* (2013.01); *H01L 2224/04026* (2013.01); *H01L 2224/05557* (2013.01); *H01L 2224/06051* (2013.01); *H01L 2224/06183* (2013.01); *H01L 2224/26145* (2013.01); *H01L 2224/2732* (2013.01); *H01L 2224/2919* (2013.01); *H01L 2224/2929* (2013.01); *H01L 2224/29294* (2013.01); *H01L 2224/29339* (2013.01); *H01L 2224/32013* (2013.01); *H01L 2224/32058* (2013.01); *H01L 2224/32105* (2013.01); *H01L 2224/32106* (2013.01); *H01L 2224/32225* (2013.01); *H01L 2224/32227* (2013.01); *H01L 2224/48227* (2013.01); *H01L 2224/838* (2013.01); *H01L 2224/83101* (2013.01); *H01L 2224/83365* (2013.01); *H01L 2224/83851* (2013.01); *H01L 2224/83862* (2013.01); *H01L 2224/83871* (2013.01); *H01L 2224/83907* (2013.01); *H01L 2224/92247* (2013.01); *H01L 2224/95* (2013.01); *H01L 2924/00014* (2013.01); *H01L 2924/10156* (2013.01); *H01L 2924/3841* (2013.01)

(58) Field of Classification Search
CPC ............. H01L 41/338; H01L 21/76254; H01L 21/76259; H01L 24/05; H01L 24/06; H01L 24/95; H01L 21/268; H01L 21/52; H01L 2224/838; H01L 2224/32225; H01L 21/3043
USPC ......................................................... 257/620
See application file for complete search history.

(56) References Cited

U.S. PATENT DOCUMENTS

| | | | |
|---|---|---|---|
| 2005/0236378 | A1 | 10/2005 | Boyle et al. |
| 2006/0017061 | A1 | 1/2006 | Sakamoto et al. |
| 2006/0197203 | A1 | 9/2006 | Chu et al. |
| 2006/0202219 | A1 | 9/2006 | Ohashi et al. |
| 2007/0173036 | A1 | 7/2007 | Kusunoki |
| 2008/0315232 | A1* | 12/2008 | Matsuo .................... H01L 33/46 257/98 |
| 2009/0321953 | A1* | 12/2009 | Kang ................... H01L 23/3114 257/777 |
| 2010/0108361 | A1* | 5/2010 | Sakaguchi ............ H01L 21/486 174/251 |
| 2011/0001148 | A1* | 1/2011 | Sun ........................ H01L 33/60 257/88 |
| 2012/0083059 | A1 | 4/2012 | Hoshino et al. |
| 2012/0181679 | A1 | 7/2012 | Kadoguchi et al. |
| 2012/0261693 | A1* | 10/2012 | Chen ..................... H01L 33/642 257/98 |
| 2012/0306031 | A1 | 12/2012 | Lo et al. |
| 2013/0000098 | A1* | 1/2013 | Moulzolf ............. F16B 11/006 29/428 |
| 2013/0115755 | A1* | 5/2013 | Engelhardt ............. H01L 21/78 438/460 |

FOREIGN PATENT DOCUMENTS

| | | |
|---|---|---|
| EP | 1478023 A1 | 11/2004 |
| EP | 1746664 A1 | 1/2007 |
| JP | H9-172029 A | 6/1997 |
| JP | 2005-333122 A | 12/2005 |
| JP | 2006-93594 A | 4/2006 |
| JP | 2006-253298 A | 9/2006 |
| JP | 2007-109822 A | 4/2007 |
| JP | 2008-166445 A | 7/2008 |
| JP | 2009-004625 A | 1/2009 |
| JP | 2010-186916 A | 8/2010 |
| JP | 2011-129612 A | 6/2011 |
| JP | 2011-210925 A | 10/2011 |
| JP | 2012-4478 A | 1/2012 |
| JP | 2012-79800 A | 4/2012 |
| JP | 5050127 B1 | 10/2012 |
| JP | 2013-004528 A | 1/2013 |
| KR | 10-2005-0007320 A | 1/2005 |
| KR | 10-2008-0112947 A | 12/2008 |

OTHER PUBLICATIONS

International Search Report for PCT/JP2013/077979 dated Jan. 7, 2014.
Taiwanese Office Action with partial English translation, corresponds to related JP application No. 2007-109822.
An Office Action; "Notice of Reasons for Rejection," issued by the Japanese Patent Office dated Aug. 9, 2016, which corresponds to Japanese Patent Application No. 2015-511072 and is related to U.S. Appl. No. 14/766,414; with partial English language translation.
Communication pursuant to Rule 164(1) EPC issued by the European Patent Office dated Sep. 9, 2016, which corresponds to European Patent Application No. 13881860.4-1552 and is related to U.S. Appl. No. 14/766,414.
Schuetz G.; "Surface Texture From Ra to Rz"; Nov. 1, 2002; pp. 1-2; Modern Machine Shop. URL: http://www.mmsonline.com/columns/surface-texture-from-ra-to-rz [retrieved on Aug. 31, 2016].
An Office Action issued by the Korean Patent Office dated Jul. 18, 2016, which corresponds to Korean Patent Application No. 10-2015-7025408 and is related to U.S. Appl. No. 14/766,414; with partial English language translation.
The Office Action, "Notification of Reason for Rejection", issued by Japanese Patent Office dated Sep. 19, 2017, which corresponds to Japanese Patent Application No. 2015-511072 and is related to U.S. Appl. No. 14/766,414; with English translation.
The Office Action, "Notice of Final Rejection", issued by Korean Patent Office dated Jul. 31, 2017, which corresponds to Korean Patent Application No. 10-2015-7025408 and is related to U.S. Appl. No. 14/766,414; with Partial English translation.
An Office Action; "The Preliminary Rejection" issued by the Korean Patent Office dated Jan. 26, 2017, which corresponds to Korean Patent Application No. 10-2015-7025408 and is related to U.S. Appl. No. 14/766,414; with partial English language translation.
An Office Action; "Notification of Reasons for Rejection" issued by the Japanese Patent Office dated Feb. 21, 2017, which corresponds to Japanese Patent Application No. 2015-511072 and is related to U.S. Appl. No. 14/766,414; with partial English language translation.
The extended European search report issued by the European Patent Office dated Dec. 12, 2016, which corresponds to European Patent Application No. 13881860.4-1552 and is related to U.S. Appl. No. 14/766,414.
The First Office Action issued by Chinese Patent Office dated May 4, 2017, which corresponds to Chinese Patent Application No. 201380075504.3 and is related to U.S. Appl. No. 14/766,414; with English language partial translation.
An Office Action issued by the Korean Patent Office dated Sep. 29, 2017, which corresponds to Korean Patent Application 10-2015-7025408 and is related to U.S. Appl. No. 14/766,414.
An Office Action issued by Chinese Patent Office dated Feb. 7, 2018, which corresponds to Chinese Patent Application No. 201380075504.3 and is related to U.S. Appl. No. 14/766,414; with English language translation.

(56) References Cited

OTHER PUBLICATIONS

An Office Action issued by the European Patent Office dated May 14, 2019, which corresponds to European Patent Application No. 13881860.4 and is related to U.S. Appl. No. 14/766,414.
Communication pursuant to Article 94(3) EPC issued by the European Patent Office dated Jul. 1, 2021, which corresponds to European Patent Application No. 113881860.4-1212 and is related to U.S. Appl. No. 14/766,414.

* cited by examiner

FIG. 5

| | Side surface (Cross section) | Surface roughness |
|---|---|---|
| Laser dicing A<br>Surface roughness<br>Rz:12μm | | |
| Laser dicing B<br>Surface roughness<br>Rz:4μm | | |
| Laser dicing C<br>Surface roughness<br>Rz:4μm | | |
| Laser dicing D<br>Surface roughness<br>Rz:4μm | | |
| Blade dicing A<br>(Grain size #3000)<br>Surface roughness<br>Rz:1μm | | |
| Blade dicing B<br>(Grain size #4800)<br>Surface roughness<br>Rz:0.3μm | | |

| Dicing Mode | Laser Dicing | Blade Dicing (Grain size #4800-#3000) | Scribe Breaking |
|---|---|---|---|
| Device Side surface roughness Rz | About 4-12 μm | About 0.3-1 μm | 0.3 μm or less |
| time taken for the adhesive to climb up to the device upper surface | 5 minutes or less | About 24 hours | About 24 hours |

SEMICONDUCTOR DEVICE HAVING A DEVICE FIXED ON A SUBSTRATE WITH AN ADHESIVE

TECHNICAL FIELD

The present invention relates to a semiconductor device having a diced device fixed on a mount substrate with an adhesive and a method of manufacturing the semiconductor device.

BACKGROUND ART

An operation to cut a wafer or the like along longitudinal and lateral directions to separate the wafer into individual devices (chips) is called dicing. There are chiefly three methods of dicing. The first of them is a blade dicing method in which an extremely thin circular blade called a diamond blade is rotated at a high speed to cut a wafer.

The second is a scribe breaking in which a wafer is scribed with an edge of a diamond and mechanical stress is thereafter produced in the wafer to cut the wafer. The third is a laser dicing method in which a wafer is cut by using laser light. By laser dicing, laser energy is concentrated to sublimate, melt or ionize a portion of a wafer material, thereby separating the wafer into individual devices.

Patent Literature 1 discloses a dicing technique using a combination of laser dicing and blade dicing. In this technique, a laser beam is applied along a dicing street on a wafer to form a worked groove, and the wafer is cut along the worked groove by using a blade.

PRIOR ART

Patent Literature

Patent Literature 1: Japanese Patent Laid-Open No. 2012-4478

SUMMARY OF INVENTION

Technical Problem

Laser dicing is of a high throughput and high yield in comparison with blade dicing and scribe breaking. Further, laser dicing is capable of reducing the cut width (dicing street width) and, therefore, capable of increasing the number of devices taken.

However, when a wafer or the like is diced by laser dicing, molten material is formed on side surfaces of the device. There is a problem that when die bonding is performed by bringing a device lower surface into contact with an adhesive, the adhesive climbs up along the molten material on the device side surfaces to reach a device upper surface. Electrode pads on the device upper surface are thereby contaminated, thereby reducing the strength of joining between the electrode pads and wires. In a case where an electrically conductive adhesive is used, there is a problem that an electrical short occurs due to the adhesive having climbed up onto the device upper surface.

In the technique disclosed in Patent Literature 1, almost the entire wafer is cut by blade dicing and there is, therefore, a problem that the blade moving speed cannot be increased and the productivity cannot be improved.

The present invention has been achieved to solve the above-described problems, and an object of the present invention is to provide a semiconductor device capable of preventing climbing up of an adhesive while improving the productivity and a method of manufacturing the semiconductor device.

Means for Solving the Problems

According to the present invention, there is provided a semiconductor device including a mount substrate, an adhesive applied to the mount substrate, and a device having its lower surface bonded to the mount substrate with the adhesive, wherein the surface roughness of a side surface upper portion of the device is lower than that of a side surface lower portion of the device.

According to the present invention, there is also provided a semiconductor device manufacturing method including a laser dicing step of separating a wafer into individual devices by forming through holes in the wafer by laser dicing, a removal step of removing, with a blade or by etching, a molten material formed on side surfaces of the device in the laser dicing step, a die bonding step of bonding a mount substrate and a lower surface of the device to each other with an adhesive after the removal step, and an adhesive curing step of curing the adhesive.

Advantageous Effects of Invention

According to the present invention, a semiconductor device capable of preventing climbing up of an adhesive while improving the productivity can be provided.

BRIEF DESCRIPTION OF THE DRAWINGS

FIG. 5 shows photographs for comparison between the surface roughness Rz of the device side surface after laser dicing and the surface roughness Rz after blade dicing.

DESCRIPTION OF EMBODIMENTS

Figure 1:
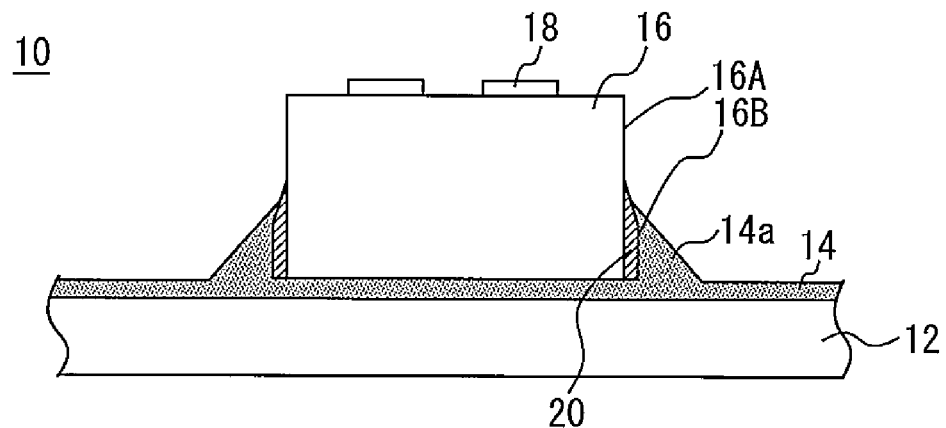
FIG. 1 is a sectional view of a semiconductor device according to Embodiment 1 of the present invention.

A semiconductor device and a semiconductor device manufacturing method according to an embodiment of the present invention will be described with reference to the drawings. Components identical or corresponding to each other are indicated by the same reference characters and repeated description for them is omitted in some cases.

Embodiment 1

FIG. 1 is a sectional view of a semiconductor device according to Embodiment 1 of the present invention. A semiconductor device 10 has a mount substrate 12. An adhesive 14 is applied to the mount substrate 12. The mount substrate 12 and a lower surface of a device 16 are bonded to each other with the adhesive 14. The device 16 is formed, for example, of a compound semiconductor such as GaAs. An upper surface of the device 16 is an active region on which electrode pads 18 are formed.

A dicing trace with a surface roughness Rz of 1.0 μm or less is formed on a side surface upper portion 16A of the device 16. A molten material 20 is formed on a side surface lower portion 16B of the device 16 as a result of melting of GaAs caused by laser dicing. The molten material 20 is a dicing trace formed by laser dicing. The molten material 20 is porous and has minute cracks. Accordingly, the side surface lower portion 16B of the device 16 is a rough surface having a surface roughness Rz of 4.0 μm or more.

A part 14a of the adhesive 14 climbs up on the side surface lower portion 16B high in surface roughness Rz. The part 14a of the adhesive 14, however, does not reach the side surface upper portion 16A low in surface roughness Rz.

Figure 2:
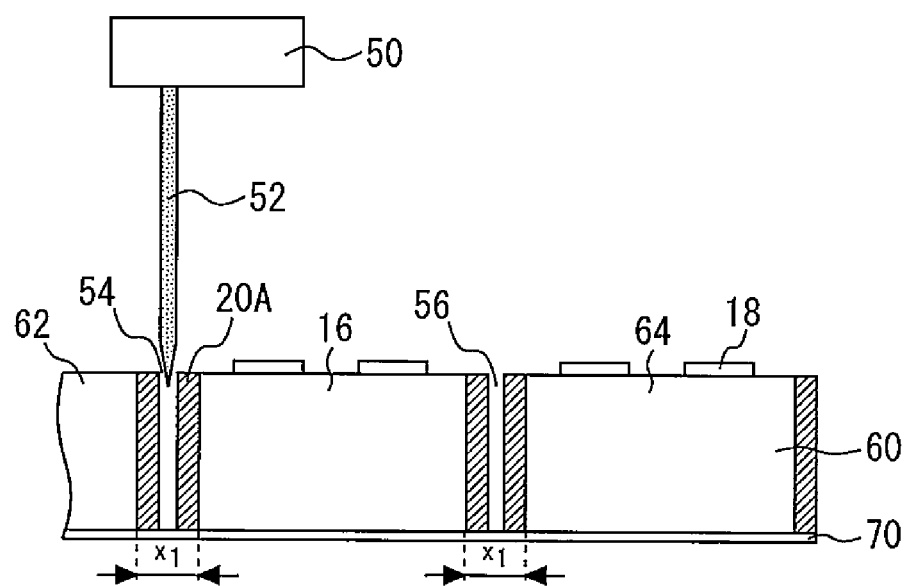
FIG. 2 is a sectional view of a wafer showing a state of laser dicing.

A method of manufacturing the semiconductor device 10 will be described. Laser dicing is first performed on a wafer. FIG. 2 is a sectional view of a wafer showing a state of laser dicing. A wafer 60 is diced with laser light 52 emitted after being amplified in a laser device 50. Through holes 54 and 56 are formed by laser dicing along a dicing street on the wafer 60, thereby separating into individual devices 62, 16, and 64. This process step is referred to as a laser dicing step. As is well known, the laser dicing step is executed by adhering a dicing tape 70 to a lower surface of the wafer 60.

A molten material 20A produced at the time of laser dicing is formed on side surfaces of each device. The sum of the width of the through hole 54 and the widths of the molten material 20A on opposite sides of the through hole 54 is x1. The value x1 is, for example, in the range from 10 to 20 μm.

Figure 3:
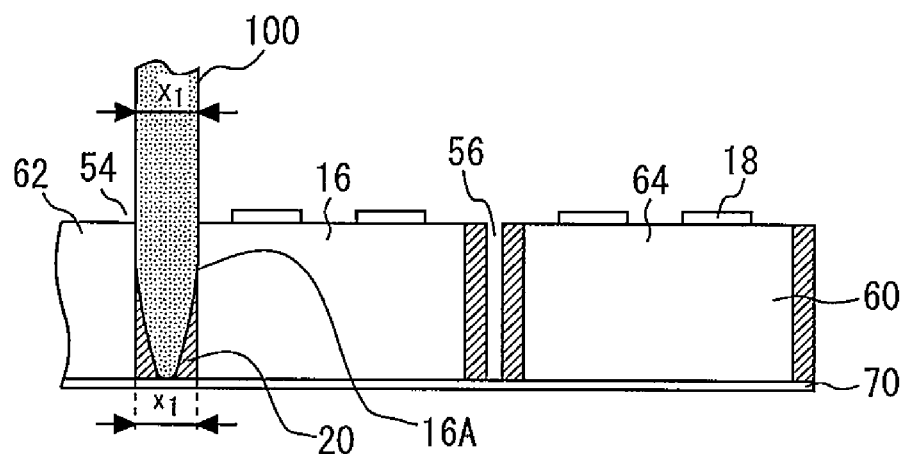
FIG. 3 is a sectional view showing removal of the molten material.

Subsequently, the molten material 20A formed on the side surfaces of the devices in the laser dicing step is removed with a blade. This process step is referred to as removal step. FIG. 3 is a sectional view showing removal of the molten material. A blade 100 having a width of x1 is moved in a direction toward the viewer (or away from the viewer) along the through hole 54 to remove the molten material 20A. A dicing trace is formed on the side surface upper portion 16A with the blade 100, the side surface upper portion 16A thereby being caused to have a surface roughness Rz of 1.0 μm or less. In this step, the molten material 20A is not entirely removed, the molten material 20 is left on side surface lower portions.

Figure 4:
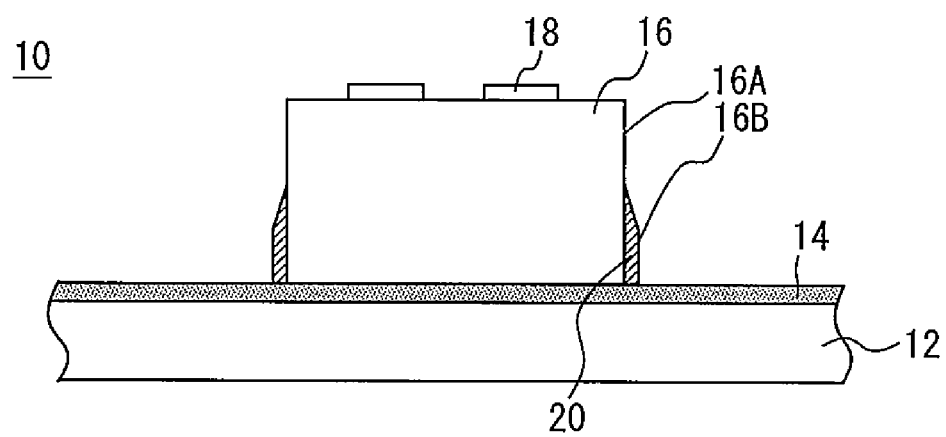
FIG. 4 is sectional view showing the die bonding step.

After the removal step, the mount substrate and the lower surface of the device are bonded to each other with the adhesive. This process step is referred to as a die bonding step. FIG. 4 is a sectional view showing the die bonding step. The adhesive 14 is Ag paste having electrical conductivity. For example, the adhesive 14 may be formed of a material in liquid or film form.

After a lapse of a certain "standby time period" from the completion of the die bonding step, the adhesive is cured. This process step is referred to as an adhesive curing step. In the adhesive curing step, the adhesive 14 is cured by heating or UV application. Wire bonding is performed as desired on electrode pads 18 after the adhesive curing step.

FIG. 5 shows photographs for comparison between the surface roughness Rz of the device side surface after laser dicing and the surface roughness Rz after blade dicing. Laser dicing photographs A to D show side surface conditions and surface roughnesses when laser dicing was performed by using four oscillators differing in oscillation frequency. The surface roughness Rz of the device side surface as a result of laser dicing is 4 to 12 μm.

The surface roughness Rz of the device side surface when blade dicing was performed was 1 μm or less. Accordingly, the surface roughness Rz of the side surface upper portion 16A formed by blade dicing is 1 μm or less, while the surface roughness Rz of the side surface lower portion 16B formed by laser dicing is 4.0 μm or more.

Figures 6, 7:
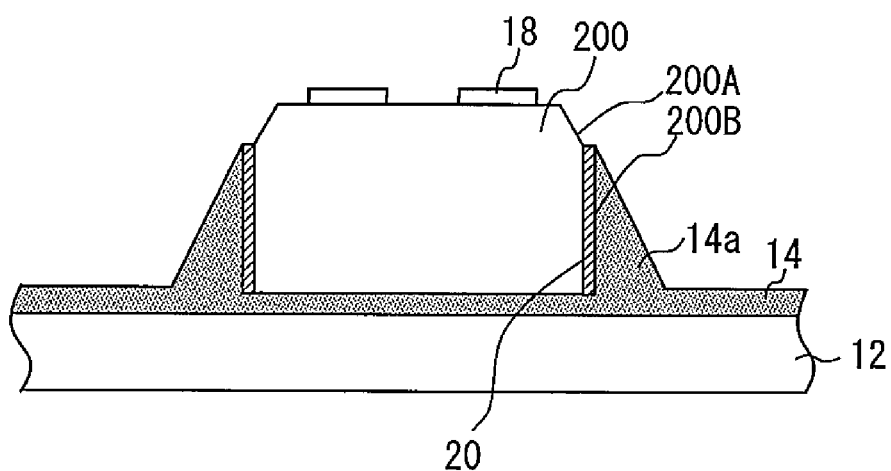
FIG. 6 is table showing, with respect to dicing methods, the surface roughness Rz of the device side surface and the time taken for the adhesive to climb up to the device upper surface.
FIG. 7 is a sectional view of a semiconductor device according to Embodiment 2 of the present invention.

FIG. 6 is a table showing, with respect to dicing methods, the surface roughness Rz of the device side surface and the time taken for the adhesive to climb up to the device upper surface. In the case of laser dicing, the surface roughness Rz of the device side surface is high and the time taken for the adhesive to climb up to the device upper surface is short. On the other hand, in the case of blade dicing or scribe breaking, the surface roughness Rz of the device side surface is low and the time taken for the adhesive to climb up to the device upper surface is long.

In the semiconductor device 10 according to Embodiment 1 of the present invention, the surface roughness Rz of the device side surface upper portion 16A is 1.0 μm or less. Therefore, even if the standby time period from the completion of the die bonding step to the adhesive curing step is increased, it is possible to prevent the adhesive 14 from reaching the device upper surface by climbing up on the device side surface. Setting a long standby time period enables adoption of batch processing with higher production efficiency.

Since the surface roughness Rz of the side surface upper portion 16A is reduced, it is possible to prevent the adhesive 14 from reaching the device upper surface even if the amount of the adhesive 14 varies largely. Climbing up of the adhesive 14 can thus be presented by the side surface upper portion 16A. A wider choice of adhesives can therefore be provided. For example, a highly functional heat-conductive adhesive, an adhesive capable of improving the joining strength, an adhesive having high wettability or an adhesive of a low viscosity can be used.

When an operation to fully cut the wafer by blade dicing is performed, the blade moving speed cannot be increased and the productivity cannot be improved. In the semiconductor device manufacturing method according to Embodiment 1 of the present invention, however, the wafer is first fully cut by laser dicing capable of high-speed dicing and the part of the molten material 20A is thereafter removed with the blade 100. Dicing can thereby by completed in a short time in comparison with full cutting of the wafer with a blade, thus enabling improving the productivity. The mode in which only the molten material on the side surface upper portion is removed is adopted for the purpose of achieving a processing speed higher than that in the case of removing the entire molten material and for the purpose of reducing the amount of wear of the blade and the frequency of blade replacement operation.

In blade dicing methods, the necessary dicing street width is ordinarily 50 to 100 μm. In laser dicing according to the present invention, however, the blade width x1 can be within the range from 10 to 20 μm and the number of devices to be taken can therefore be increased by reducing the width of the dicing street.

The surface roughnesses Rz of the side surface upper portion 16A and the side surface lower portion 16B are not limited to the above-mentioned values. Climbing up of the adhesive 14 can be prevented as long as the surface roughness of the side surface upper portion 16A is set lower than the surface roughness of the side surface lower portion 16B by using the semiconductor device manufacturing method according to Embodiment 1 of the present invention.

The device according to Embodiment 1 of the present invention can adopt various materials which are not limited to GaAs. For example, the device may be formed of a ceramic. While the molten material 20 is removed with the blade 100, wet etching or dry etching may be performed to remove the molten material 20. While the molten material on the side surface upper portion of the device is removed in the removal step, the molten material on the entire side surface may be removed. Any adhesive may suffice if it is capable of bonding the mount substrate and the device to each other. The adhesive is not limited to electrically conductive materials. These modifications can also be applied to Embodiment 2 described below.

Embodiment 2

A semiconductor device and a semiconductor device manufacturing method according to Embodiment 2 have a number of commonalities with Embodiment 1, and will therefore be described mainly with respect to points of difference from Embodiment 1. FIG. 7 is a sectional view of a semiconductor device according to Embodiment 2 of the present invention. In this semiconductor device, a lower surface of a device 200 is fixed to a mount substrate 12 with the adhesive 14.

A side surface upper portion 200A of the device 200 is a slanting surface. A dicing trace with a surface roughness Rz of 1.0 μm or less is formed on a side surface upper portion 200A. A molten material 20 is formed on a side surface lower portion 200B as a result of melting of GaAs caused by laser dicing. The molten material 20 is a dicing trace formed by laser dicing. The side surface lower portion 200B is therefore a rough surface having a surface roughness Rz of 4.0 μm or more.

Figure 8:
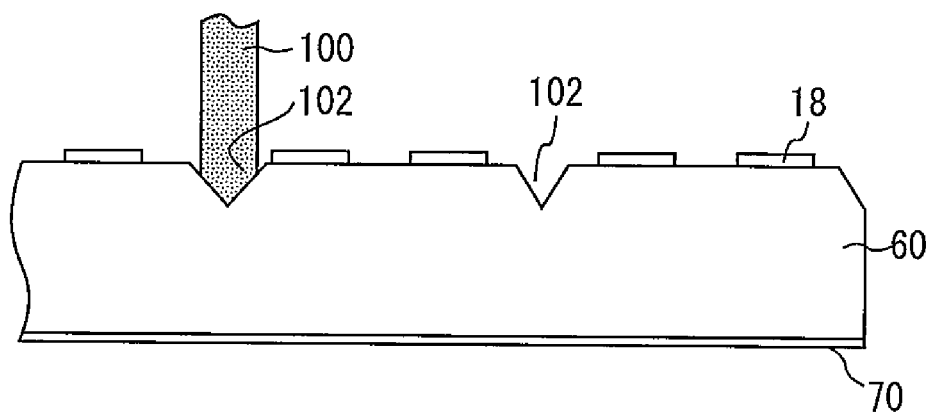
FIG. 8 is a sectional view of the wafer, showing forming of grooves in the wafer.

A semiconductor device manufacturing method according to Embodiment 2 of the present invention will be described. Grooves are first formed in a wafer. FIG. 8 is a sectional view of the wafer, showing forming of grooves in the wafer. Grooves 102 are formed in a wafer 60 with the blade 100. Grooves 102 are formed along dicing streets.

Figure 9:
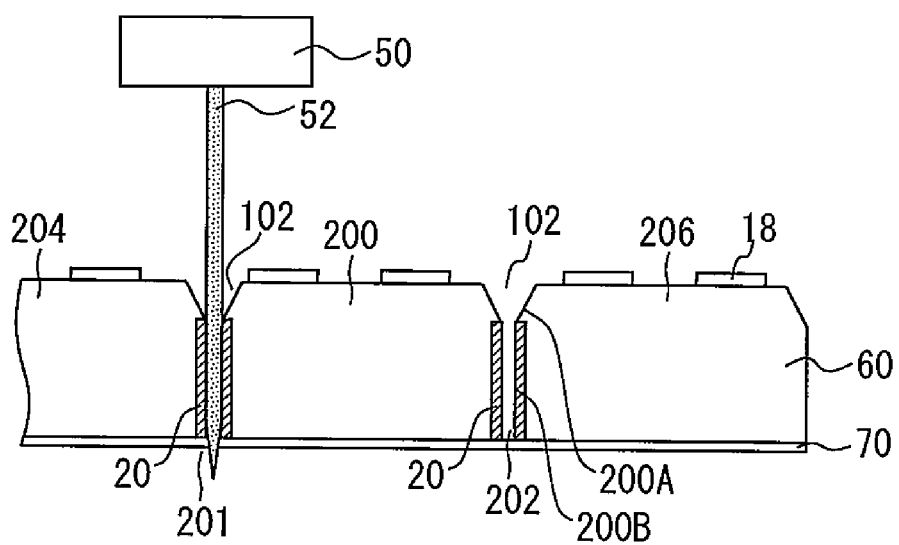
FIG. 9 is a sectional view of the wafer, showing a state of laser dicing.

Subsequently, laser dicing is performed. FIG. 9 is a sectional view of the wafer, showing a state of laser dicing. Laser dicing is performed on the portions in which the grooves 102 are formed, as seen in plan, with portions of the grooves 102 left. Through holes 201 and 202 are formed thereby. The wafer is thereby separated into individual devices 200, 204, and 206. This process step is referred to as a laser dicing step. The molten material 20 is formed on the side surface lower portions 200B by laser dicing.

Subsequently, the mount substrate 12 and a lower surface of the device 200 are bonded to each other with the adhesive 14. This process step is a die bonding step. Subsequently, after a lapse of a standby time period, the process advances to an adhesive curing step. In the adhesive curing step, the adhesive 14 is cured by heating or UV application. Subsequently, a wire bonding step is performed as desired.

In the semiconductor device according to Embodiment 2 of the present invention, the side surface upper portions 200A with a low surface roughness are formed by forming the grooves 102 with the blade 100. Subsequently, individual devices are separated by laser dicing, with the side surface upper portions 200A left thereon. Thus, the surface roughness of the side surface upper portions 200A can be reduced and climbing up of the adhesive can therefore be prevented. The grooves 102 may be formed by etching instead of being formed with the blade 100.

DESCRIPTION OF SYMBOLS 10 semiconductor device, 12 mount substrate, 14 adhesive, 14a a part of the adhesive, 16 device, 16A side surface upper portion, 16B side surface lower portion, 18 electrode pads, 20,20A molten material, 50 laser device, 52 laser light, 54,56 through hole, 60 wafer, 70 dicing tape, 100 blade, 102 grooves, 200 device, 200A side surface upper portion, 200B side surface lower portion, 201,202 through holes

The invention claimed is:

1. A semiconductor device comprising:
   a mount substrate;
   an adhesive applied to the mount substrate; and
   a device having its lower surface bonded to the mount substrate with the adhesive,
   wherein a surface roughness of a side surface upper portion of a side surface of the device is lower than that of a side surface lower portion of the side surface of the device,
   wherein, on the side surface of the device, the adhesive contacts only the side surface lower portion,
   wherein the side surface lower portion is porous, and
   wherein a total width of the device at the side surface lower portion where the adhesive is in contact is greater than a total width of the device at the side surface upper portion.

2. The semiconductor device according to claim 1, wherein a dicing trace with a surface roughness Rz of 1.0 μm or less is formed on the side surface upper portion of the side surface of the device, and
   a dicing trace with a surface roughness Rz of 4.0 μm or more is formed on the side surface lower portion of the side surface of the device.

3. The semiconductor device according to claim 1, wherein the side surface upper portion of the side surface of the device is slanted relative to the side surface lower portion of the side surface of the device.

4. A semiconductor device comprising:
   a mount substrate;
   an adhesive applied to the mount substrate; and
   a device having its lower surface bonded to the mount substrate with the adhesive,
   wherein a surface roughness of a side surface upper portion of the device is lower than that of a side surface lower portion of the device,
   wherein the side surface lower portion of the device extends from the side surface upper portion of the device to the lower surface of the device,
   wherein, on the side surface of the device, the adhesive contacts only the side surface lower portion,
   wherein the side surface lower portion is porous, and
   wherein a total width of the device at the side surface lower portion where the adhesive is in contact is greater than a total width of the device at the side surface upper portion.

5. The semiconductor device according to claim 4, wherein the side surface upper portion of the device is slanted relative to the side surface lower portion of the device.

* * * * *